United States Patent [19]

Wiedmann

[11] Patent Number: 4,694,433
[45] Date of Patent: Sep. 15, 1987

[54] SEMICONDUCTOR MEMORY HAVING SUBARRAYS AND PARTIAL WORD LINES

[75] Inventor: Siegfried K. Wiedmann, Stuttgart, Fed. Rep. of Germany

[73] Assignee: International Business Machines Corporation, Armonk, N.Y.

[21] Appl. No.: 719,945

[22] Filed: Apr. 4, 1985

[30] Foreign Application Priority Data

May 14, 1984 [EP] European Pat. Off. ........ 84105426.5

[51] Int. Cl.⁴ .............................................. G11C 8/00
[52] U.S. Cl. .................................... 365/230; 365/190
[58] Field of Search ............... 365/230, 189, 190, 205, 365/207, 208, 63

[56] References Cited

U.S. PATENT DOCUMENTS

| | | | |
|---|---|---|---|
| 3,959,781 | 5/1976 | Mehta et al. | 365/210 |
| 4,090,255 | 5/1978 | Berger et al. | 365/189 |
| 4,222,112 | 9/1980 | Clemons et al. | 365/189 |
| 4,266,283 | 5/1981 | Perlegos et al. | 365/104 |
| 4,527,256 | 7/1985 | Giebel | 365/189 |
| 4,596,000 | 6/1986 | Wiedmann | 365/189 |

FOREIGN PATENT DOCUMENTS

| | | |
|---|---|---|
| 0078338 | 5/1983 | European Pat. Off. . |
| 3326943 | 2/1984 | Fed. Rep. of Germany . |
| 3337850 | 4/1984 | Fed. Rep. of Germany . |

OTHER PUBLICATIONS

Buscaglia, "Write Select Scheme for Schottky Coupled Cell with Early Upper Word Line Deselect", IBM Tech. Disc. Bulletin, vol. 26, No. 7B, Dec. 1983, pp. 3630–3631.

Baier et al., "A 256K NMOS DRAM", IEEE ISSCC Digest of Technical Papers, 2-24-84, pp. 274–275, 353.

Patent Abstracts of Japan, vol. 4, No. 172 (P-38) Nov. 27, 1980; JP A 55 117 786 (Matsushita Denki Sangyo K.K.) 10-09-1980.

Patent Abstracts of Japan, vol. 5, No. 41 (P-56, Apr. 11, 1981; (Hitachi Seisakusho K.K.) 24-01-1981.

IBM Technical Disclosure Bulletin, vol. 13, No. 7, Dec. 1970, pp. 1927–1928, by N. F. Brickman, "Large Scale Integration".

Electrical Design News, vol. 17, No. 10, May 15, 1972, pp. 60–61, D. Pearson—"How to Tailor Your Memory Needs with a Minimum of External Parts".

Primary Examiner—Stuart N. Hecker
Assistant Examiner—Glenn A. Gossage
Attorney, Agent, or Firm—William T. Ellis

[57] ABSTRACT

A memory structure for very large memory arrays on a chip is described where the memory array is divided into a number of subarrays. The subarrays are controlled via common word decoders and subarray decoders. The word lines of the individual subarrays are individually selectable through word line switches, and the bit lines of the subarrays are applied directly to a common line system, and interconnected in such a manner that the peripheral circuits, e.g. the data input and output circuits, can be arranged in practically any free location on the chip.

5 Claims, 4 Drawing Figures

SEMICONDUCTOR MEMORY HAVING SUBARRAYS AND PARTIAL WORD LINES

DESCRIPTION

1. Field of Invention

The invention generally relates to a semiconductor memory and more particularly, to a semiconductor memory specially arranged for high integration density and storage capacity and for short access time operation with low power dissipation in accordance with the preamble of patent claim 1.

2. Description of the Prior Art

In storages with bipolar transistors and field effect transistors it is common practice to divide the row or word lines into sectors. Such a memory is described e.g. in U.S. Pat. No. 3,959,781. This memory is characterized in that the row lines have respective right and left line sectors, that a number of scanning amplifiers corresponding to the number of row lines are arranged in a column in such a manner that each of the amplifiers connects a right-hand line sector with a left-hand line sector, that the memory cells each comprise a field effect transistor where the gate is connected to one of the column lines and the source or drain connection to one of the row lines, as well as a capacitive storage element, that furthermore several auxiliary cells are provided one of which is respectively connected to one of the right or left row line sectors, and that a common input/output line is arranged at one end of the row lines, and connected thereto, the common line being such that it can be coupled to several of the memory cells for the scanning amplifiers. Owing to the fact that the word circuits are arranged in the middle between the left and right word line, the effective word line capacity is halved. Nevertheless, this word line capacity is still too high particularly for memories with a very large number of memory cells per word line, so that such a suggestion is not applicable to maximum integration memories with very high data storage capacity. The fixing of the circuits in the middle of a chip involves inflexible demands with respect to the design. Furthermore, the word lines can be selected only after discharging, with the consequence of a loss of speed. Besides, there exist high capacitive currents which cause an increased power dissipation and disturbances within the storage matrix.

Furthermore, in section X 53: 256 K/1 MB DRAMS-II, on the IEEE International Solid-State Circuits Conference 1984, published in the Digest of Technical Papers, pp. 274, 275 and 353, a 256 K NMOS DRAM has been published which is divided into several part matrices or subarrays, respectively. To reach the necessary speed for reading as well as writing, a storage hierarchy was structured on the chip in such a manner that buffers are arranged in the middle of the chip between the individual subarrays. Reading and writing is effected via these buffers. Although buffers are required here to increase the speed of operation, this storage has nevertheless a relatively low reading and writing speed and is furthermore entirely unsuitable for even bigger storages that have to operate with very low currents, e.g. memories with MTL cells. The chip surface for the actual memory is limited by the buffers and driver circuits.

In order to double the capacity of a storage, European application No. 81 109 372 published a solution for field effect transistor storages where the outputs of the scanning latches are connected to two pairs of cross-coupled charge storage elements as bit line coupling transistors, and where bit line pairs expanded by twice their number with the charge coupling elements are connected. Furthermore, an additional bit line is arranged to control the additional memory cells in separate sectors, each sector having its own reference cells and being connected to the sensor latch via layers designed as low capacity lines, and via charge coupling elements. Although, making use of a second metallization layer for wiring and the self-insulating characteristics of the FET latches used as read amplifiers a doubling of the number of bits per bit line is achieved without the cell size having to be increased, and without the read signal having to be undesirably reduced to such an extent that more complex peripheral circuitry is required, an expanding of the bit word lines and the problems specifically connected therewith is neither displayed nor referred to so that this solution cannot be used, either, for memories with a very high storage capacity in maximum integration technique.

A memory with a very high storage capacity and extremely short access time with minimum power dissipation and maximum integration density is described in applicant's pending European patent application No. 83 105 171.9. This semiconductor memory comprises word lines divided into several partial word lines or sectors. Each partial word line is connected to a word switch, and all word switches of a word line are selectable and controllable via a first word control line and a second word control line. Although a circuit concept is thus suggested which avoids the above described disadvantages, and although by subdividing the word lines into several partial word lines, and by inserting separately controllable word circuits for each partial word line the effective word line capacity has been reduced to 1/N of the entire effective word line capacity without subdivision, this concept needs further improvement if, as necessary for storage chips with extremely high capacity the integration density, the access time and the power dissipation are to be further improved considerably.

SUMMARY OF THE INVENTION

It is therefore the object of the present invention to improve a VLSI semiconductor memory having static or dynamic storage cells and being divided into a number of submatrices or subarrays, and having its word lines divided into several partial word lines or sectors, each partial word line being connected to a word switch selectable and controllable via word control lines, to the effect that in spite of a considerably improved storage density, storage capacity and speed the overall power dissipation can be significantly reduced Although with increasing integration density and storage capacity on a chip, and with a significant increase of the read and write speed in the picosecond range as well as in the genuine nanosecond range the power dissipation usually increases considerably in the known storage structures, a solution has now been found which reverses this formerly known trend. Particularly for storage chips with a capacity in the megabit range the solution turns for the first time into a direction which makes it possible to provide memories on a chip with such a high storage capacity with minimum access time and power dissipation. By dividing the storage matrix on the chip into many subarrays or part matrices, the number of storage cells on a word line of a subarray corresponding to the number of data bits, it is for the first time that only the word and bit lines of the selected subarray are triggered, so that only a fraction of the capacitive charging has to be effected compared with the formerly known systems. As a consequence, much lower driver currents and power dissipations are necessary. Furthermore, owing to the manner of interconnecting the bit lines of all subarrays via the read and write switches these systems do not require more switching elements than the formerly known arrangements. The same advantage of saving driver current is achieved as if the overall memory were divided into several complete partial memories, without additional peripheral circuitry which would otherwise be absolutely necessary for such a solution. By decoupling the bit lines of non-selected subarrays by means of the read and write switches the effective bit line capacity is now reduced by the factor N, too, so that for typical figures of N=8, 16, 32 the power dissipation can be reduced by more than one order.

BRIEF DESCRIPTION OF THE DRAWING

The invention will now be described in detail with reference to an embodiment specified in the drawings which represent the following.

DESCRIPTION OF THE PREFERRED EMBODIMENTS

Figure 1:
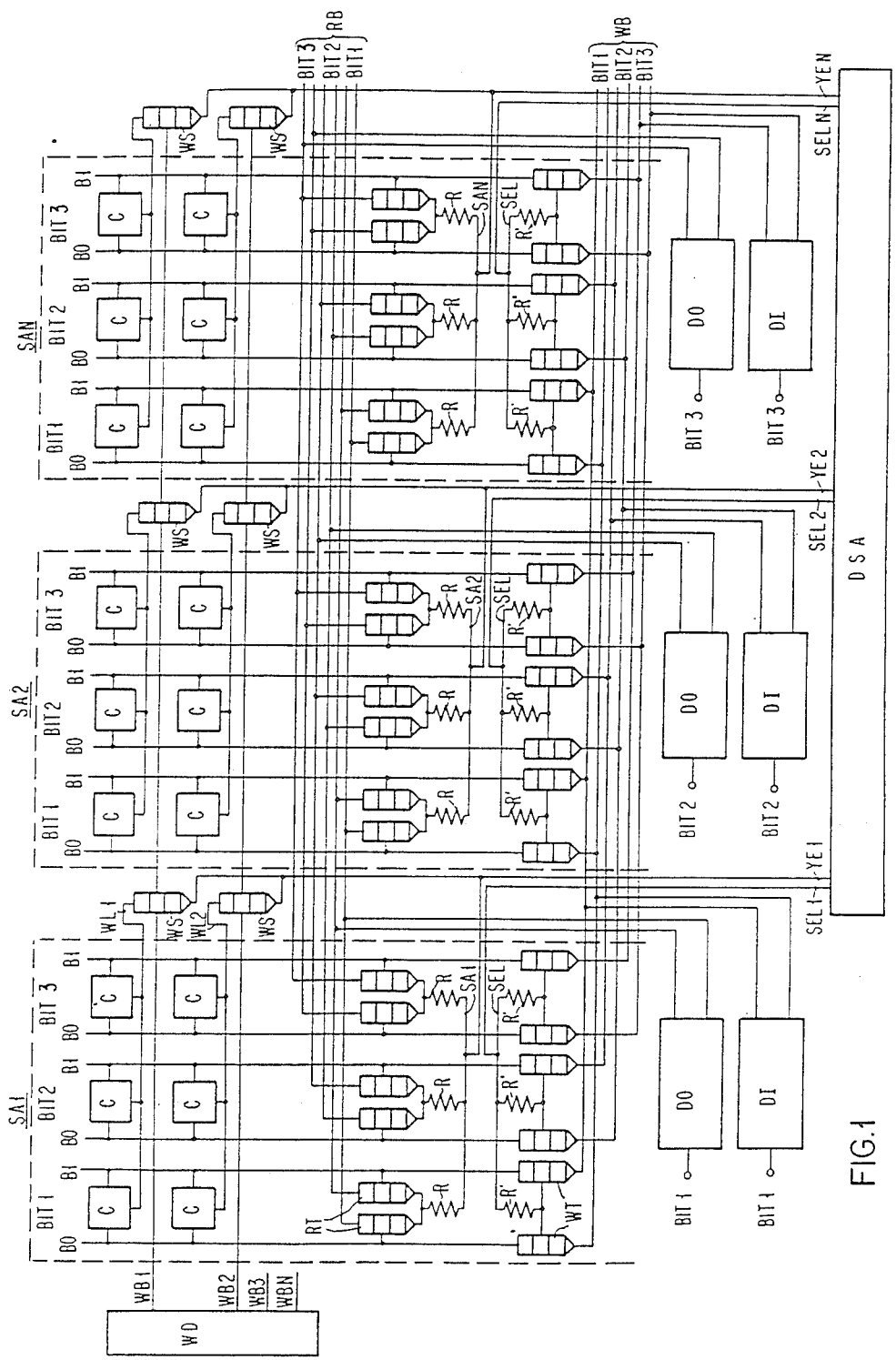
FIG. 1 is a detailed overall diagram of a storage provided on a chip and subdivided into several subarrays in accordance with the present invention.

The memory of FIG. 1 is provided on one single semiconductor chip. The memory is subdivided into several subarrays SA 1 to SA N. The number of bit line pairs B0, B1 of a subarray corresponds to the number of external data inputs and data outputs. The number of bit line pairs of a subarray can also correspond to an integer multiple of the number of the external data inputs and outputs. Word decoder WD which at its inputs receives the word addresses applies its output signals not to the word lines directly but to the word control lines WB 1 to WB N in the X-coordinate. These word control lines lead to the base of the word line control switches arranged between the individual subarrays SA 1 to SA N. In other words, the word lines WL for the individual subarrays are respectively interrupted in an interface, and can be selectively switched on and off with a word line control switch WS. Besides, each subarray SA 1 to SA N comprises a control line YE 1 to YE N in the Y-coordinate, which is connected to the emitters of the word line control switches. The word lines WL of each subarray SA 1 to SA N are respectively connected to the collector of a word line control switch WS. It is of particular importance to note that the word control line WB in the X-coordinate is respectively provided jointly for all subarrays SA 1 to SA N. During the operation of the memory chip, only one respective word line WL of a subarray SA 1 to SA N is selected. To give an example: word line WL 1 in subarray SA 1 is selected by a negative control pulse via a control signal YE 1 from decoder DSA for subarray SA 1, and by a positive control pulse via word control line WB 1 by word decoder WD. The cells for bits 1 to 3 which are connected to word line WL 1 are thus addressed simultaneously. Connected to each bit line pair B0, B1 a pair of read transistors RT is provided which serve as preamplifiers as well as decoupling elements for the common read lines RB of bits 1 to 3. The emitters of the read transistors RT are connected in pairs via a resistor R within each subarray SA 1 to SA N with a common selection line SA 1 to SA N for the subarrays which in turn can be connected to the control line extending in Y-direction from decoder DSA for the subarrays.

The collectors of the read transistors RT of bit 1 of subarray SA 1 which serve as outputs are connected with the collectors of the bit 1 read transistors RT of all other subarrays SA 2 to SA N provided on the chip which also serve as collectors, via a common read line pair RB for bit 1. Connected to bit line pairs B0, B1, apart from read transistors RT, write switch transistors WT are provided which via the common write signal lines WB for bits 1 to 3, and through a common write select line SEL 1 to SEL N for the respective subarray SA 1 to SA N are controlled by the decoder DSA for the subarrays. The cell information 0 or 1 to be written in are applied via the corresponding common write signal lines WB for bits 1 to 3 which are connected to the emitters of the respective write switches WT of the individual subarrays SA 1 to SA N. Selection lines SEL 1 to SEL N extending from decoder DSA for the subarrays in Y-direction are connected via the common line SEL in each subarray SA 1 to SA N via resistors R' to the bases of the write transistor pairs WT. In operation, the activation of the respective write switch transistors WT via lines SEL and SEL 1 to SEL N transfers the write information of data lines WB to the corresponding bit line B0 or B1 of the associated data bit 1 to 3, i.e. either a Zero or a One is written into the respectively selected cell.

The lines for bits 1 to 3 of common read line RB are tapped in a suitable location on the chip, and connected to a data output circuit DO for each bit 1 to 3. Since relatively few external data outputs are generally used, a relatively expensive intermediate and terminal amplifier can be used for a data output circuit DO, so that in spite of a relatively high capacitive load of the common read line RB the information of the selected memory cell C very quickly reaches the external data output. Referring to the overall surface of the memory chips, the costs for the data output circuits DO are negligible, even if the number of switching elements used is high.

Similarly, the lines for bits 1 to 3 of common write line WB are tapped in a suitable location for connection with the corresponding data input circuit DI for bits 1 to 3. The data input circuit can be designed as a relatively complex circuit, too, to ensure quick switching of the write lines, in spite of a relatively high capacitance of the common write line WB.

Reference is once more made to the fact that the read and write lines for each bit 1 to 3 of the common read line RB and of the common write line WB are available jointly for all subarrays SA 1 to SA N, i.e. the read lines, e.g. of bit 1, are directly interconnected via read switches RT respectively with the bit line pair B0, B1 of bit 1 of each subarray SA 1 to SA N. This applies analogously to the write lines, too. In a read or write operation, merely the word and bit lines of the selected subarray are controlled, so that only a fraction of the capacitive recharge compared with the formerly known memories has to be processed. Consequently, much lower driver currents and power dissipations are required. By this kind of bit line interconnection of all subarrays via the read and write switches RT and WT, no additional switching elements are necessary compared with the formerly known storage organizations. There is the same advantage of saving driver current as if the overall memory were divided into several smaller memories without a greater number of peripheral circuits for each partial memory. By decoupling the bit lines from non-selected subarrays by means of the read and write switches the effective bit line capacity is reduced by the factor N, so that for typical figures of N=8, 16, 32 power dissipation can be reduced by more than one order. The common read and write line system necessitates an extremely small surface since very low currents only flow through these lines, and the number of peripheral circuits for safe operation can be increased without significant space requirements being involved.

Figure 2:
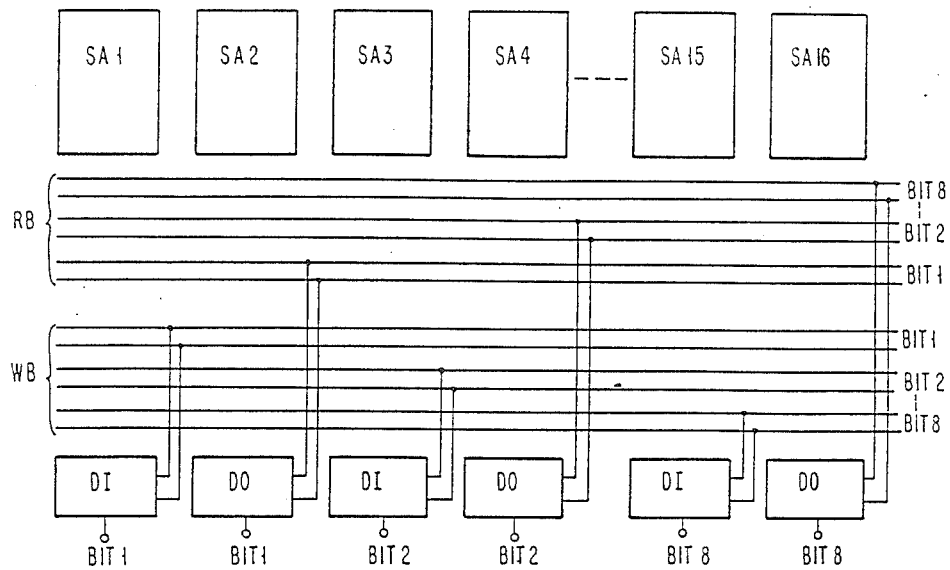
FIG. 2 is a simplified block diagram depicting the considerable variability of the arrangement of the data input and output circuits.

FIG. 2 depicts a highly reduced basic diagram with subarrays SA 1 to 16 which together form a memory on a chip. According to this reduced block diagram of FIG. 2, the read switches, write switches and bit line pairs have been omitted in order to emphasize the high variability of the principle according to the invention. Under the individual subarrays SA 1 to SA 16 there extend the common read lines RB and the write lines WB for bits 1 to 8. The data input circuits DI for bits 1 to 8, and the data output circuits DO for bits 1 to 8 are connected in this example as separate circuits to the respective common read lines RB and common write lines WB, respectively. As shown in FIG. 2, these data input and data output circuits DI and DO can be arranged on the chip with considerable variation. The subdivision does not have to be a multiple of the subdivision for subarrays SA 1 to SA 16. It is thus possible to arrange e.g. singular peripheral circuits like auxiliary voltage sources, reference circuits, clock circuits in an optimal manner between the data circuits on the chip. An essential advantage consists in that the suggested memory chip organization permits a substantially modular structure. This is e.g. highly advantageous if memory arrays of different size, so-called embedded memory arrays are to be realized. With this modular structure highly different memory sizes (e.g. 512×8, 2 K×8, 8 K×8, 512×16, etc.) can be realized with the same circuit layout and the same physical layout.

Figure 3:
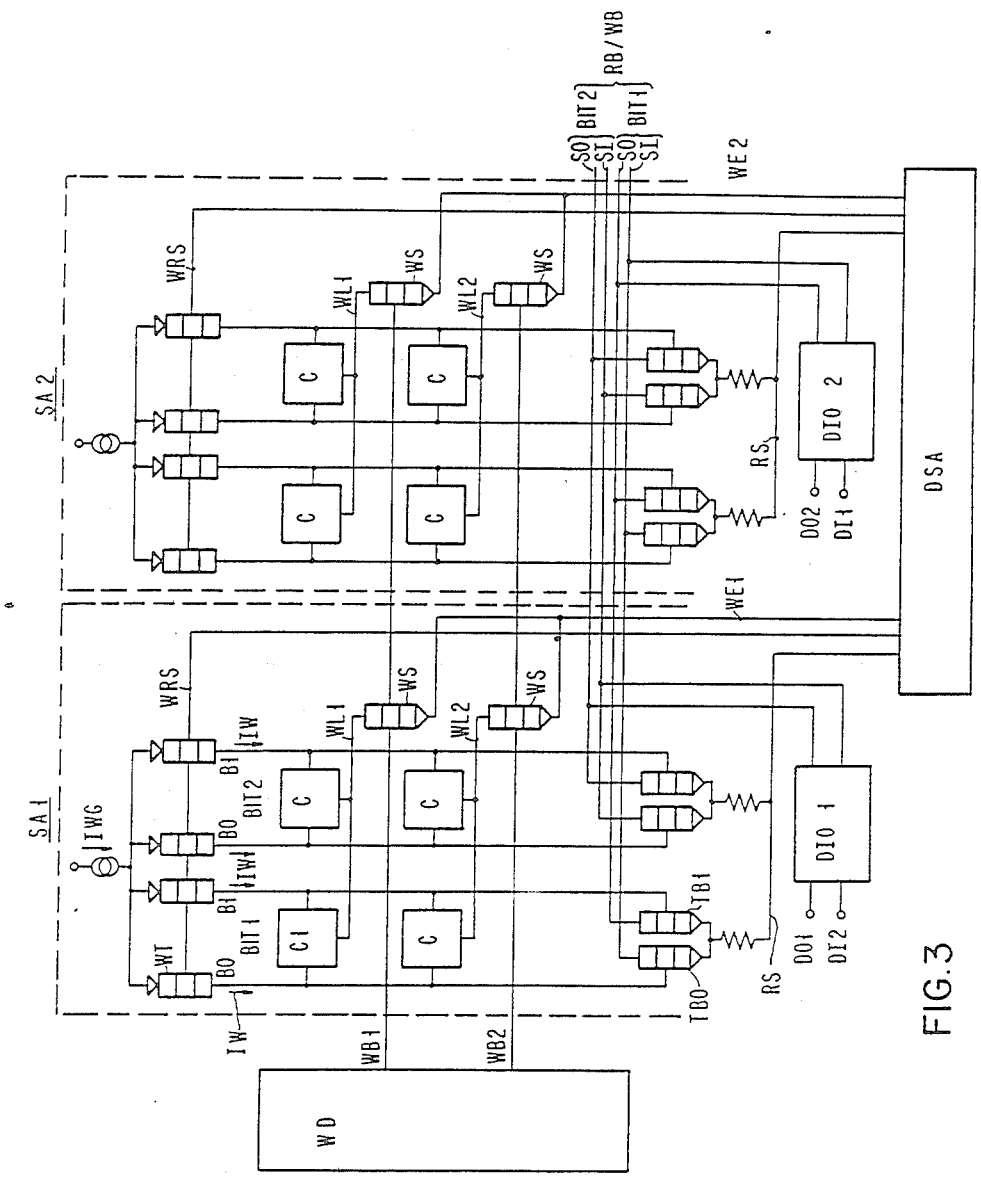
FIG. 3 is an implementation of a storage with subarrays arranged on a chip, where the common read and write lines are assembled.

FIG. 3 shows another embodiment of a memory on a chip which consists of several subarrays SA 1 to SA N separated via word line switches, only the two first subarrays SA 1 and SA 2 being represented. These subarrays are in turn controlled via word decoder WD to which the word addresses are applied, and via the decoder for subarrays DSA to which the corresponding addresses are also applied. The decoders themselves are connected via word line control lines WB 1 and WB 2 extending in X-direction, with the corresponding word switches WS in subarrays SA 1 and SA 2 respectively. Word control lines WE 1 and WE 2 as well as read selection lines RS and write selection lines WRS extend in Y-direction from decoder DSA for the subarrays. In this embodiment in accordance with FIG. 3 of the circuit arrangement, the common read and write lines are assembled in such a manner that only half of the common lines RB/WB compared with FIG. 1 are required. By means of subarray decoder DSA, a subarray SA 1 or SA 2 is selected, and the read or write elements, respectively, are activated thereby. In a read operation, the read transistors RT of the respectively selected subarray are activated by a negative pulse on the read select line RS, and the read signal of memory cells C of a word line WL is transferred to the common data lines S0, S1.

In a write operation, the bit line current sources IW which are here fed by a common current source IWG are connected by a negative write select pulse on line WRS by decoder DSA for the subarrays. When a Zero is written, e.g. into cell C1, writing current IW of bit line B0 flows into memory cell C1, whereas writing current IW in bit line B1 is caused by a negative signal in common data line SI over the collector-base diode or Schottky diode of NPN transistor TB 1. It should also be noted that this circuit arrangement comprises combined data input and output circuits DIO 1 and 2 for data outputs DO 1 and DO 2, as well as data inputs DI 2 and DI 1. Furthermore, an amplifier function of the write switches is generally not necessary since sufficiently high write signals can be applied.

Figure 4:
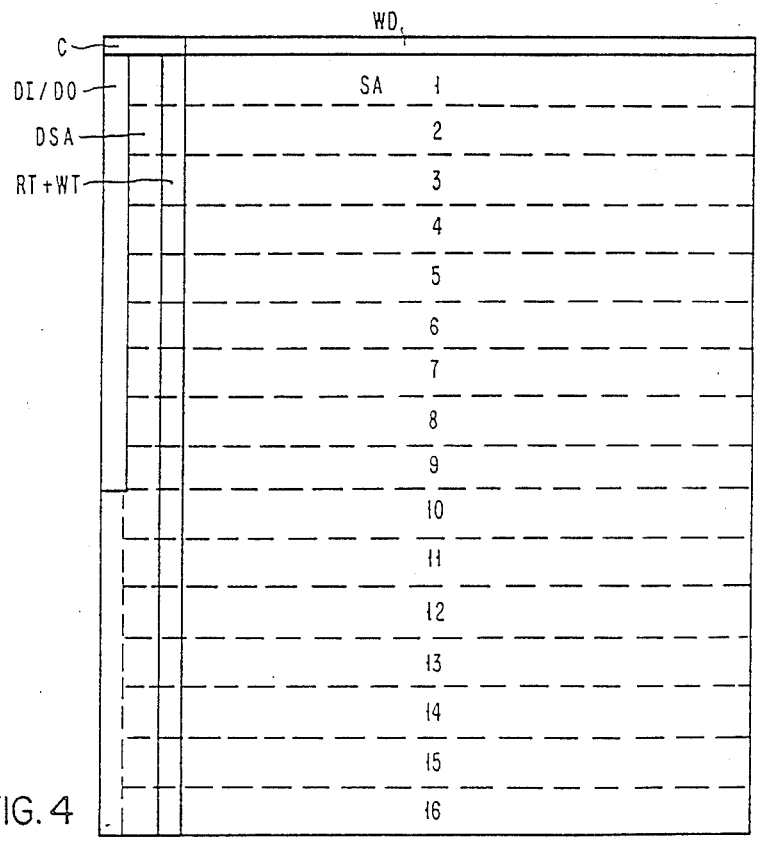
FIG. 4 is a representation according to scale of a memory chip with 16 subarrays, the associated decoders and peripheral circuits.

FIG. 4 represents the actual dimensions of the various components on a chip of an assumed edge length of 5.4×6.8 mm. At the upper edge, control circuits C are arranged on the left, and word decoder WD is provided on the right thereof. Vertically below this the 16 subarrays with e.g. 512×8 memory cells each are arranged. Between the individual subarrays, in the order of the dashed lines, the word line switches and selection lines of decoder DSA for the subarrays are provided. In the left-hand vertical field there are the data input and data outpt circuits DI and DO, whereas the read/write switches RT and WT are in this example provided directly at the subarray decoder DSA. This memory chip thus has a capacity of 8 K×8 bits, i.e. 64 kilobits. An important reason for the relatively small surface required for the peripheral circuits lies in the new subarray organization which permitted a considerable saving of power dissipation. Due to the low currents, the surface for the common lines and other control lines and the surface for the peripheral circuits can be kept very small so that they do not appear in this representation.

I claim:

1. A semiconductor array memory comprising a plurality of selectable subarrays arranged on a chip having a common decoder, common read lines and common write lines, data input and output circuits and word lines, said word lines being divided into several partial word lines, each partial word line line being connected to a word switch,
    all word switches of a word line being selected and controlled via at least one word control line, each subarray comprising a matrix of memory cells arranged in word line rows and bit line columns, characterized in that said bit line columns of the same bit value of all subarrays in the semiconductor memory are coupled via read transistors to said common read lines and via write transistors to said common write lines, said common read lines and common write lines also being directly connected to said data input and output circuits, said read transistors isolating said common read lines from said bit line columns of unselected subarrays.

2. A semiconductor memory as claimed in claim 1, and further including selection control lines characterized in that said subarrays are connected via said selective control lines to said decoder.

3. A semiconductor array memory comprising a plurality of selectable subarrays arranged on a chip having a common decoder, a plurality of combined common read and write lines, data input and output circuits and word lines, said word lines being divided into several partial word lines, each partial word line being connected to a word switch, all word switches of a word line being selected and controlled via at least one word control line, each subarray comprising a matrix of memory cells arranged in word line rows and bit line columns, characterized in that said bit line columns of the same bit value of all subarrays in the semiconductor memory are coupled via switching means to a respective one of said combined common read and write lines, said switching means operating to isolate said combined common read and write lines from said bit line columns of unselected subarrays, said conbined common read and write lines also being directly connected to said data input and output circuits.

4. A semiconductor memory as claimed in claim 3, and further including for each subarray a common current source and a common control line connected to said decoder, characterized in that write transistors of a subarray are connected to respective ones of said bit line columns and to said common current source, and controlled via said common control line.

5. A semiconducotor memory as claimed in claim 1 or 3 and further including for each subarray a common control line connected to said decoder characterized in that read transistors of a subarray are connected to said common control line.

* * * * *